US007440480B2

(12) United States Patent
Alfano et al.

(10) Patent No.: US 7,440,480 B2
(45) Date of Patent: Oct. 21, 2008

(54) TETRAVALENT CHROMIUM DOPED LASER MATERIALS AND NIR TUNABLE LASERS

(75) Inventors: Robert R. Alfano, Bronx, NY (US); Vladimir Petricevic, New York, NY (US); Alexey Bykov, Bronx, NY (US)

(73) Assignee: Research Foundation of the City University of New York, New York, NY (US)

( * ) Notice: Subject to any disclaimer, the term of this patent is extended or adjusted under 35 U.S.C. 154(b) by 29 days.

(21) Appl. No.: 11/295,749

(22) Filed: Dec. 7, 2005

(65) Prior Publication Data
US 2006/0193358 A1 Aug. 31, 2006

Related U.S. Application Data

(60) Provisional application No. 60/633,441, filed on Dec. 7, 2004.

(51) Int. Cl.
*H01S 3/16* (2006.01)
(52) U.S. Cl. .............................. 372/41; 372/66; 372/70
(58) Field of Classification Search .................... 372/41
See application file for complete search history.

(56) References Cited

U.S. PATENT DOCUMENTS

| | | | |
|---|---|---|---|
| 4,932,031 A | | 6/1990 | Alfano et al. |
| 4,987,575 A | * | 1/1991 | Alfano et al. ................. 372/41 |
| 6,104,529 A | | 8/2000 | Brandle, Jr. et al. |
| 2006/0109878 A1 | * | 5/2006 | Rothenberg ................... 372/35 |

OTHER PUBLICATIONS

HazenKamp et al., Optical spectroscopy of Cr4+ -doped Ca2geO4 and Mg2SiO4, Physical Review B, vol. 53, No. 5, 1996.*
Sharonov et al. (Optical properties of Cunyite (Cr4+:Ca2geO4) co-doped with Er3+ ions, Optical Communications 209, p. 209-216, 2002).*
Angert et al., "Lasing Due to Impurity Color Centers in Yttrium Aluminum Garnet Crystals at Wavelengths in the Range 1.35-1.45μm," *Soviet J. Quantum Electronics*, 18(1):73-74 (1988).
Chen et al., "Growth Mechanism of Cr:forsterite Laser Crystal with High Cr Concentration," *Optical Materials*, 24:163-168 (2003).

(Continued)

*Primary Examiner*—Dung T Nguyen
(74) *Attorney, Agent, or Firm*—Darby & Darby, P.C.; Bruce E. Black

(57) ABSTRACT

A method is described to improve and produce purer $Cr^{4+}$-doped laser materials and lasers with reduced co-incorporation of chromium in any other valence states, such as $Cr^{3+}$, $Cr^{2+}$, $Cr^{5+}$, and $Cr^{6+}$. The method includes: 1) certain crystals of olivine structure with large cation (Ca) in octahedral sites such as $Cr^{4+}:Ca_2GeO_4$, $Cr^{4+}:Ca_2SiO_4$, $Cr^{4+}:Ca_2Ge_xSi_{1-x}O_4$ (where 0<x<1), and/or 2) high-temperature solution growth techniques that enable the growth of the crystals below the temperature of polymorphic transitions by using low melting point solvent based on oxide, fluoride and/or chloride compounds. Purer $Cr^{4+}$-doped laser materials are characterized by a relatively high concentration of $Cr^{4+}$-lasing ion in crystalline host that makes these materials suitable for compact high power (thin disk/wedge) NIR laser applications.

22 Claims, 5 Drawing Sheets

OTHER PUBLICATIONS

Deka et al., "Laser Performance of $Cr^{4+}:Y_2SiO_5$," *Applied Physics Letters*, 61(18):2141-2143 (1992).

Feldman et al., "Dynamics of Chromium Ion Valence Transformations in Cr,Ca:YAG Crystals used as Laser Gain and Passive Q-switching Media," *Optical Materials*, 24:333-344 (2003).

Brauch et al., "Multiwatt Diode-pumped Yb:YAG Thin Disk Laser Continuously Tunable Between 1018 and 1053 nm," *Opt. Lett.*, 20(7):713-715 (1995).

Hazenkamp et al., "Optical Spectroscopy of $Cr^{4+}$-doped $Ca_2GeO_4$ and $Mg_2SiO_4$," *Phys. Rev.*, 53(5):2367-2377 (1996).

Jia et al., "Spectroscopy of $Cr^{3+}$ and $Cr^{4+}$ Ions in Forsterite," *Phys. Rev.*, 43(7):5234-5242 (1991).

Koetke et al., "Quasi-continuous Wave Laser Operation of $Cr^{4+}$-doped $Y_2SiO_5$ at Room Temperature," *Optics Communication*, 101(3,4):195-198 (1993).

Kuck et al., "Tunable Room-Temperature Laser Action of $Cr^{4+-doped}Y_3Sc_xAl_{5-x}O_{12}$," *Appl. Phys. B.*, 58:153-156 (1994).

Lai, S. T., "Highly Efficient Emerald Laser," *J. Opt. Soc. Am. B.*, 4(8):1286-1290 (1987).

Mass et al., "Oxygen Activity Dependence of the Chromium (IV) Population in Chromium-doped Forsterite Crystals Grown by the Floating Zone Technique," *J. of Crystal Growth*, 165(3):250-257 (1996).

Moulton, P. F., "Spectroscopic and Laser Characteristics of $Ti:Al_2O_3$," *J. Opt. Soc. Am. B.*, 3(1):125-133 (1986).

Payne et al., "$LiCaAlF_6:Cr^{3+}$: A Promising New Solid-State Laser Material," *J. Quant. Elect.*, 24(11):2243-2252 (1988).

Payne et al., "Laser Performance of $LiSrAlF_6:Cr^{3+}$," *J. Appl.Phys.*, 66(3):1051-1056 (1989).

Payne et al., "Optical Spectroscopy of the New Laser Materials, $LiSrAlF_6:Cr^{3+}$ and $LiCaAlF_6:Cr^{3+}$," *J. Luminescence*, 44:167-176 (1989).

Petricevic et al., "Laser Action in Chromium-activated Forsterite for Near-infrared Excitation: Is $Cr^{4+}$ the Lasing Ion?," *Appl. Phys. Lett.*, 53(26):2590-2592 (1988).

Petricevic et al., "Room-temperature Near-Infrared Tunable Laser Operation of $Cr^{4+}:Ca_2GeO_4$," *Opt. Lett.*, 21(21):1750-1752 (1996).

Petricevic et al., "Pulsed Laser Operation of $Cr^{4+}:LiSeGeO_4$ at 1.3 µm," *CLEO 97*, CTuE7 9:30AM, pp. 77-78 (1997).

Robbins et al., "The System Magnesium Oxide-germanium Dioxide," *Amer. J. Science*, 257:63-70 (1959).

Schafer et al., "Organic Dye Solution Laser," *Appl. Phys. Lett.*, 9(8):306-309 (1966).

Shkadarevich, A. P., "Recent Advances in Tunable Solid State Lasers," *Opt. Soc. Amer.*, 5:60-65 (1989).

Voss et al., "Efficient High-power Diode-pumped Thin-disk Yb:YAG-Laser," *Proc. SPIE*, 2426:501-508 (1995).

Walling et al., "Tunable CW Alexandrite Laser," *IEEE J. Quant. Elect.*, QE-16(2):120-121 (1980).

\* cited by examiner

TETRAVALENT CHROMIUM DOPED LASER MATERIALS AND NIR TUNABLE LASERS

RELATED APPLICATIONS

This patent application claims the benefit of U.S. Provisional Patent Application Ser. No. 60/633,441, filed Dec. 7, 2004, incorporated herein by reference.

STATEMENT REGARDING FEDERALLY SPONSORED RESEARCH OR DEVELOPMENT

This invention was made with government support under Grant No. NCC-1-03009 awarded by NASA and Grant No. W911NF0410023 from the U.S. Department of Defense. The government may have certain rights in this invention.

BACKGROUND

The development of tunable solid state lasers based on the $Cr^{4+}$-ion started in 1988 with forsterite, $Cr:Mg_2SiO_4$ [V. Petricevic, S. K. Gayen and R. R. Alfano, Appl. Phys. Letters 53 (1988) 2590]. It was extended to other crystalline media, such as $Cr^{4+}$-doped $Y_3Al_5O_{12}$ [A. P. Shkadarevich, in: OSA Proceedings on Tunable Solid State Lasers, Ed. M. L. Shand and H. P. Jenssen (Optical Society of America, Washington, D.C., 1989), Vol. 5, pp. 60-65], $Y_2SiO_5$ [J. Koetke, S. Kuck, K. Petermann, G. Huber, G. Gerullo, M. Danailov, V. Magni, L. F. Qian, and O. Svelto, Opt.Commun. 101 (1993) 195], $Y_3Sc_xAl_{5-x}O_{12}$ [S. Kuck, K. Peterman, U. Pohlmann, U. Schonhoff, and G. Huber, Appl.Phys. B58, (1994) 153]. These latter materials retain chromium dopant in crystalline structure in other valence states, which act as traps and reduce the concentration of $Cr^{4+}$ lasing ions.

The $Cr^{4+}$-ions in tetrahedral coordination is useful for realization of room temperature tunable solid state laser operation in the spectral range from 1.1 to 2 µm. Unfortunately, for all the materials listed above, the concentration of $Cr^{4+}$ ions in the crystalline structure was lower than 0.1%, and chromium in other valence states (for example, $Cr^{3+}$ and $Cr^{2+}$) was present in those crystals. This led to complicated spectroscopic properties of the materials. As a result, the active media length in the laser devices was too high for at least some applications. This took these crystals out of consideration for small micro-laser development, where thickness of laser element generally does not exceed a few mm in length.

BRIEF SUMMARY

One embodiment is a laser medium, comprising a single crystal of $Cr^{4+}:Ca_2Ge_xSi_{1-x}O_4$, where $0<x<1$. A variety of lasers can be formed using this laser medium.

Another embodiment is a single crystal of $Cr^{4+}:Ca_2Ge_xSi_{1-x}O_4$, where $0 \leq x \leq 1$ and the single crystal has at least 1 wt. % $Cr^{4+}$. A variety of lasers can be formed using this laser medium.

Yet another embodiment is a method of making a laser medium. The method includes forming an undoped crystal substrate of $Ca_2Ge_ySi_{1-y}O_4$, where $0 \leq y \leq 1$, and forming a layer of $Cr^{4+}:Ca_2Ge_xSi_{1-x}O_4$, where $0 \leq x \leq 1$, on the substrate by liquid phase epitaxy.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention pertains to tunable lasers and more particularly to laser materials (e.g., laser media) containing one or more single crystals of certain germinates/silicates, $Cr^{4+}:Ca_2GeO_4$ $Cr^{4+}:Ca_2SiO_4$, $Cr^{4+}:Ca_2Ge_xSi_{1-x}O_4$ (where $0<x<$ structures enabling much higher doping level of $Cr^{4+}$ laser active ions than in the past. These $Cr^{4+}$-doped germanates/silicates are olivine-type structure materials allowing a relatively high doping level of $Cr^{4+}$ without co-incorporation of Cr-ions in other valence state, particularly $Cr^{3+}$ and $Cr^{2+}$. In particular, $Cr^{4+}$ doped materials have been made in which the presence of other valence states of chromium has not been observed spectroscopically.

These $Cr^{4+}$-doped materials are suitable for the development of, for example, tunable micro-laser and compact laser systems utilizing thin layers (e.g., disks) of these (preferably, heavy-doped) materials. When the length of a laser element is reduced so that it becomes substantially smaller than its diameter, the laser-active medium generally cannot be cooled any longer on its circumference. Instead, the heat can be removed across the front facets of the thin disc or a slab using a specially designed heat sink. Presuming a relatively high value heat transfer coefficient over the whole area, a temperature field is typically established in the crystal with the isotherms essentially normal to the optical axis. As a result, the index of refraction is practically independent of the radius. Hence, a plane wave traveling along the axis does not experience radial phase shifts.

Figure 1A:
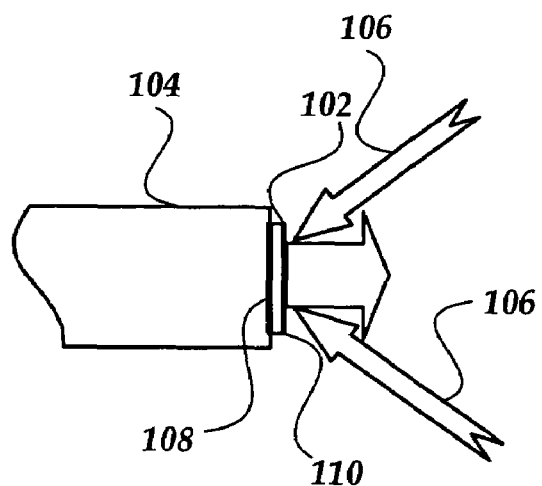
FIG. 1A is a schematic illustration of a first embodiment of a laser, according to the invention.
Figure 1B:
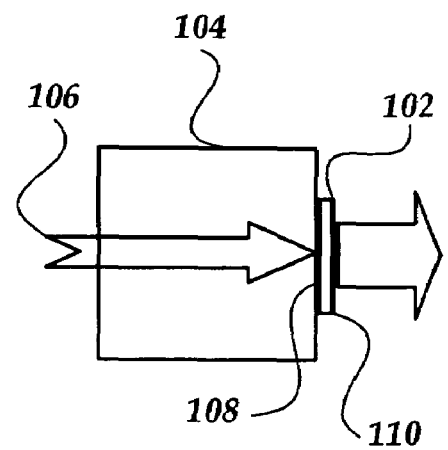
FIG. 1B is a schematic illustration of a second embodiment of a laser, according to the invention.

FIGS. 1A and 1B illustrate two different designs for better heat management that can be realized for a thin disk or slab laser systems depending on pumping geometry. In both concepts the dielectric mirror coatings 108, 110 on the disk itself define the resonator of the oscillator. In the first configuration (FIG. 1A), the cooled face of the disc 102 is optically coated to act as a total reflector, the disk is mounted on a heat sink 104 (e.g., a copper heat sink), and pumping light 106 is directed to the front disk surface. In another configuration (FIG. 1B), the cooled face of the disk 102 is transparent to pumping radiation and highly reflecting for laser emission, the laser disk is mounted on a transparent heat sink 104 (e.g., a sapphire heat sink) and axial back pumping light 106 is directed through the transparent sapphire heat sink is applied.

In a modified version (FIG. 2) of the first configuration, the cooled face of the disk 102 (in this embodiment, a wedge slab) is optically coated to act as a total reflector, the wedge slab can be used as an active element to increase pump efficiency. The reflective coatings 108, 110 are on different components of the laser forming a resonator cavity 112. The disk 102 also includes an antireflective coating 114 on the surface that receives the pumping light 106.

The thin disk laser assembly designed for diode-pumped solid-state lasers was first put forward in 1992. It has been successfully applied to Yb:YAG lasers, [V. Andreas, B. Uwe, W. Klaus and G. Adolf. *Proc. SPIE* 2426 (1995), p. 501. U. Brauch, A. Giesen, M. Karszewski, Chr. Stewen and A. Voss. *Opt. Lett.* 20 (1995), p. 713], to generate high output power. A thin disc of the laser active material, with a thickness of a few hundred micrometers, was mounted on a heat sink, which resulted in only a small thermal lens because of the axial heat flow in the thin disk. Multiple absorption passes of the pump radiation through the ultra-thin laser crystal were usually needed for Yb or Nd—doped laser crystals because the crystal's optical density is low.

$Cr^{4+}$-doped materials disclosed herein can have unusually high optical density providing a better opportunity for only single pass pumping process. Therefore, in at least some embodiments, a thin disk laser system design based on purely $Cr^{4+}$-doped materials does not use complicated schemes to pump the thin disk by multiple absorption passes.

An estimation of number of absorption passes to be needed to pump a thin layer of $Ca_2GeO_4$ is described. Polarized absorption spectra, emission spectrum, and lifetime versus Cr concentration for $Cr^{4+}:Ca_2GeO_4$ crystals are shown in FIGS. 3 and 4.

Figure 3:
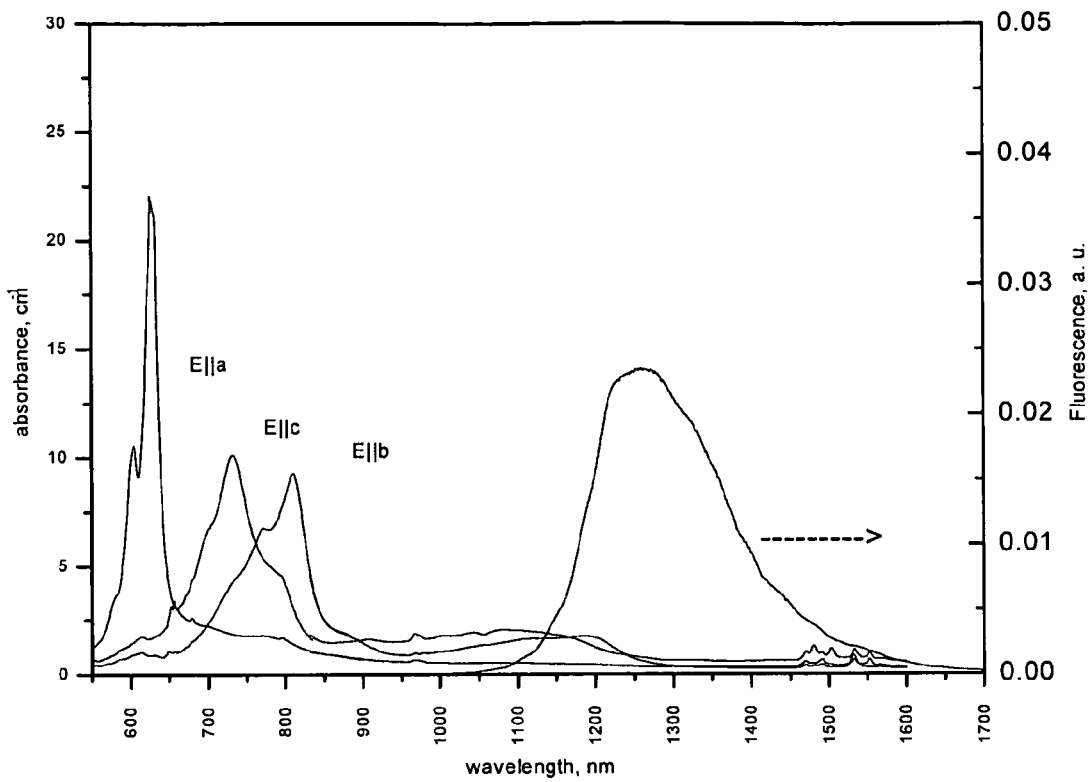
FIG. 3 is absorbance and fluorescence spectra for $Cr^{4+}$:$Ca_2GeO_4$.
Figure 4:
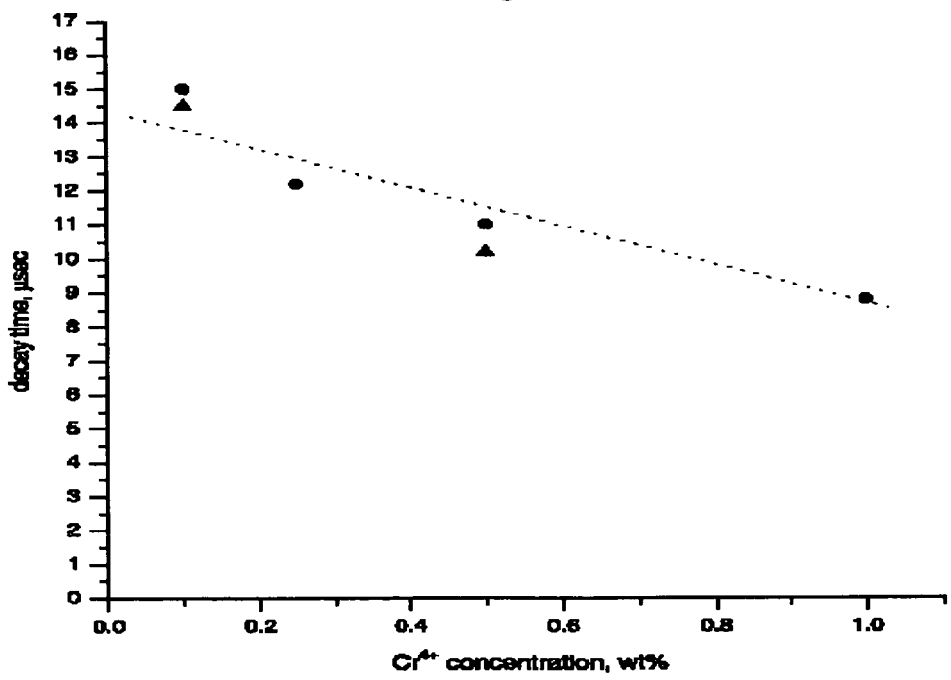
FIG. 4 is a graph of decay time vs. $Cr^{4+}$ concentration for $Cr^{4+}:Ca_2GeO_4$.

Absorption Coefficient:

From absorption spectra in FIG. 3:
@ 808 nm (E∥b, Pbnm)=~9 cm$^{-1}$
@ 840 nm (E∥b, Pbnm)=~8 cm$^{-1}$
@ 980 nm (E∥c Pbnm)=~2 cm$^{-1}$ Concentration Quenching:

Quantum efficiency (including temperature quenching), at 300K:

$$\eta = \frac{W(77K)}{W(300K, wt\ \%)};$$

where W is the rate of decay [sec$^{-1}$]. W(77K)=40,000 sec$^{-1}$ (rate of decay at 77K and at low concentration (c<0.1 wt. %) was obtained from low-temperature measurements.) W(300K) is the rate of decay from room temperature measurements. (See FIG. 4.) The quantum efficiency is then calculated to be:

$\eta$(0.1 wt %)=50%

$\eta$(0.2 wt. %)=43%

$\eta$(0.5 wt. %)=37%

$\eta$(1.0 wt. %)=30%

It was calculated that $\eta$(2.0 wt. %)=16%. Because this value is very low, it will not be considered.

A layer will absorb power, P, according to the following equation: $P=P_0(1-10^{-kln})$, where k is the absorption coefficient (see FIG. 3), l is a length, and n is number of paths. Table 1 and 2 below show absorbed power in dependence on wavelength of pumping and number of paths for 100 μm and 200 μm layer of $Ca_2GeO_4$ doped with 1 wt. % of $Cr^{4+}$. Efficiency is calculated as a product of quantum efficiency $\eta_1$ due to thermal and concentration quenching (listed above) and efficiency $\eta_2$ due to difference between energy of absorbed and emitted photons.

TABLE 1

Absorbed power as a function of pumping wavelength and number of paths for 100 μm layer of $Ca_2GeO_4$ doped with 1 wt. % of $Cr^{4+}$.

| λ\#Paths | 1 | 2 | 3 | 4 | Efficiency ($\eta_1*\eta_2$) |
|---|---|---|---|---|---|
| 808 nm, E∥b | 87% | 98% | 100% | 100% | 17% |
| 830 nm E∥b | 84% | 97% | 99% | 100% | 18% |
| 980 nm E∥c | 37% | 60% | 74% | 84% | 21% |

TABLE 2

Absorbed power as a function of pumping wavelength and number of paths for 200 μm layer of $Ca_2GeO_4$ doped with 1 wt. % of $Cr^{4+}$.

| λ\#Paths | 1 | 2 | 3 | 4 | Efficiency ($\eta_1*\eta_2$) |
|---|---|---|---|---|---|
| 808 nm, E∥b | 98% | 100% | 100% | 100% | 17% |
| 830 nm E∥b | 97% | 100% | 100% | 100% | 18% |
| 980 nm E∥c | 60% | 84% | 100% | 100% | 21% |

As can be seen from Table 1, at pumping wavelengths of 808 nm and 830 nm, more than 80% of initial power is absorbed in a single pass through a 100 μm layer of $Ca_2GeO_4$ doped with 1 wt. % of $Cr^{4+}$. The 200 μm layer absorbs almost 100% of pumping energy (98% and 97%) at 808 nm and 830 nm, and 60% at 980 nm.

A method for producing pure $Cr^{4+}$-doped laser material without co-incorporation of chromium in any other valence state, such as $Cr^{3+}$, $Cr^{2+}$, $Cr^{5+}$, and $Cr^{6+}$ is discussed below. It will be recognized that there may be small amounts of chromium in these valence states. The method includes 1) forming certain crystals of olivine structure, such as $Cr^{4+}:Ca_2GeO_4$, $Cr^{4+}:Ca_2SiO_4$, $Cr^{4+}:Ca_2Ge_xSi_{1-x}O_4$, and/or 2) high-temperature solution growth techniques, such as liquid phase epitaxy, that enable the growth of the crystals below the temperature of polymorphic transitions by using low melting point solvent based on oxide, fluoride and/or chloride compounds.

A method for producing a new and improved near infrared tunable disk mini-laser is also discussed. In at least some embodiments the laser uses only a single absorption pass of pumping radiation because of using the highly-doped $Cr^{4+}$-doped laser material used as an active laser element/disk (e.g., a laser medium). Different laser systems utilizing different pumping procedures and employing purer $Cr^{4+}$-doped laser materials are disclosed.

The present invention is also directed to the production and use of chromium-doped ($Cr^{4+}$) materials, including high-concentration tetravalent chromium-doped ($Cr^{4+}$) materials, for a variety of different types of laser including compact lasers in the near infrared spectral region.

In the past, the $Cr^4$-doped materials (forsterite, YAG) always contained substantial amounts of chromium in other valence states, particularly $Cr^{3+}$. As a result, creating a high concentration of tetravalent chromium laser ion in those materials was not possible. The length of crystalline laser elements to be used for these devices exceeded 5-10 mm which is often considered too big for compact lasers. Development of a number of new crystals belonging to olivine structure family opens the opportunity to build laser systems utilizing heavily-doped thin layers as an active media.

Figure 5:
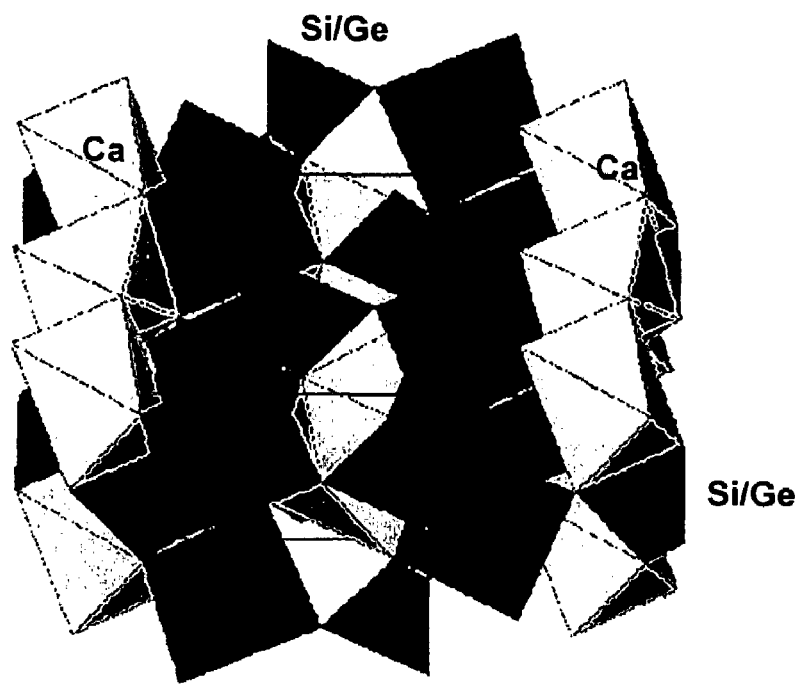
FIG. 5 is a schematic representation of the olivine crystal structure with $AX_4$ tetrahedra and $BX_6$ octahedra.

The crystal lattice of olivine contains a dispersion of occupied and unoccupied $AX_4$ tetrahedra and $BX_6$ octahedra groups formed by oxygen ions throughout the crystal as illustrated in FIG. 5. The $BX_6$ groups are linked by edges into zigzag shaped rows that are separated by corridors containing no octahedral voids. The discrete $AX_4$ groups are located at the site of occupied tetrahedral voids in this corridor (all of the other tetrahedral voids of the structure are unoccupied.) In the olivine structure Ge/Si ions occupy ⅛ of the tetrahedral interstices and metal ions (for example, calcium magnesium, iron, or manganese) occupy ½ of the octahedral voids.

In accordance with spectroscopic characteristics of Cr-doped, Ca-based olivines, $Ca_2GeO_4$, $Ca_2SiO_4$, and $Ca_2Ge_xSi_{1-x}O_4$, there is no evidence of the presence of trivalent chromium ($Cr^{3+}$), as well as $Cr^{2+}$, $Cr^{5+}$, and $Cr^{6+}$ in these materials. A feature of these doped $Ca_2GeO_4$ crystals is a relatively high concentration of tetravalent chromium ($Cr^{4+}$) due, at least in part, to favorable structure characteristics of $Ca_2GeO_4$. Although not wishing to be bound by any theory, it is believed that there are no suitable octahedral positions for trivalent chromium in the $Ca_2GeO_4$ structure because of the large ionic radius of $Ca^{2+}$ in octahedral positions, as well as the ionic radius of $Ge^{4+}$ in tetrahedral coordination is close to the ionic radius of $Cr^{4+}$ at the same site occupation. $Cr^{4+}$ can also substitute for silicon. As a result, the substitution concentration of $Cr^{4+}$ ions in $Ca_2GeO_4$ can exceed considerably the maximum level of that in other $Cr^{4+}$-doped compound. Since high active ion concentrations can be achieved without significant fluorescence concentration quenching, $Cr^{4+}$:$Ca_2GeO_4$ becomes a suitable material for diode pumping and fabrication of miniature laser and waveguide devices. For example, the tuning range of the materials described herein covers the very important 1.33-1.55 μm wavelength range.

One method of crystal growth to obtain $Cr^{4+}$:$Ca_2GeO_4$, as well as $Cr^{4+}$:$Ca_2SiO_4$, $Cr^{4+}$:$Ca_2Ge_xSi_{1-x}O_4$, is based on the Czochralski pulling technique that was modified for crystallization from high-temperature solution (flux). As an example, crystal growth of bulk $Cr^{4+}$:$Ca_2GeO_4$ crystals (boules) were carried out from $CaF_2$-based flux with $Ca_2GeO_4$ concentration of about 70 wt. %. The $Cr_2O_3$ concentration in the initial charge was varied from 0.5 wt. % up to 1.5 wt. %. The parameters of crystallization used are listed below: growth direction—[100], temperature range—1300-1350° C., pulling rate—0.2-0.1 mm/h, seed rotation speed—60-20 rpm, and growth atmosphere—nitrogen. Since the temperature interval of crystallization that exceeds 1300° C. is usually considered a maximum temperature for platinum crucible under RF-heating conditions, an iridium crucible, 5.08 cm diameter by 5.08 cm high, with 2.0 mm thick wall and bottom, and nitrogen atmosphere were chosen for the Cr:$Ca_2GeO_4$ growth procedure. Fully transparent, dark green Cr:$Ca_2GeO_4$ crystals more than 15 mm in diameter and up to 60 mm long were grown under the growth conditions described above.

The ease of $Cr^{4+}$ incorporation in $Ca_2GeO_4$ crystalline structure also permits the use liquid phase epitaxy (LPE) to fabricate high quality high concentration, $Cr^{4+}$-doped thin films and layers on appropriate undoped substrates. Liquid phase epitaxy is a process in which a single crystal layer can be grown from a dilute molten solution on a flat oriented single crystal substrate. Typically, the growth is performed at constant temperature by dipping the substrate in a supersaturated melt solution in which the solute is melted in a "suitable" solvent. The melt is characterized by an equilibrium temperature (or saturation temperature). Generally at the thermodynamic equilibrium the solute concentration (or solubility) increases with the temperature. A decrease of the temperature below the saturation temperature ($T_s$) leads generally to the crystallization of a part of the solute.

For oxide materials, one example of the LPE process is the following: The constituents of the solution are melted in a platinum crucible at about 50-100° C. above the saturation temperature. For example, the solution can include a $CaCl_2$—$CaF_2$ flux with germanium oxide, silicon oxide, and chromium oxide in the desired stoichiometric amounts. Before growth, the melt is stirred to provide complete dissolution of solute components. The substrate is mounted horizontally on a platinum holder and preheated in the furnace. The substrate has an alternate rotation of 50-100 rpm with a change every 5-10 s. Before dipping, in order to limit the temperature fluctuations, the substrate is to stay a few minutes above the melt. During growth, the melt temperature is kept constant. After the growth a rapid speed rotation (800 rpm) should be used in order to eliminate the solvent droplets. Then the substrate is pulled out of the furnace slowly in order to avoid thermal stresses.

Figure 6:
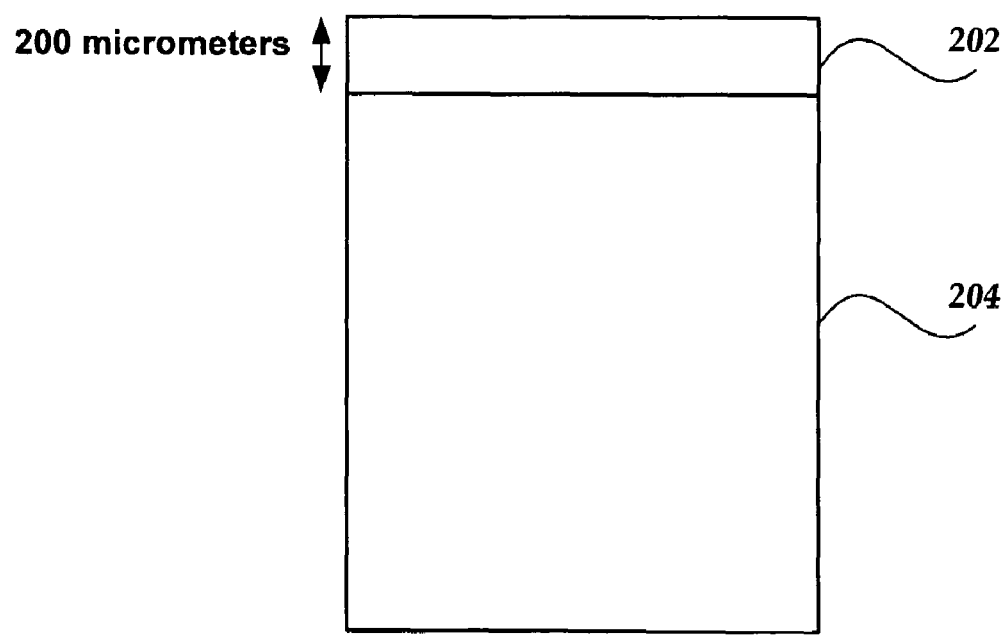
FIG. 6 is a schematic cross-sectional view of a $Cr^{4+}$:$Ca_2GeO_4$ layer grown by liquid phase epitaxy on a substrate of $Ca_2GeO_4$.

Crystalline surfaces obtained by LPE can be quasi-atomically flat depending on the structural perfection and misorientation of a singular oriented substrate surface. However, it may be useful to adjust supersaturation to grow in the regular step-flow mode. Taking these prerequisites into account we have prepared {0 1 0} $Cr^{4+}$-doped $Ca_2GeO_4$ films with "optically smooth" surface areas have been prepared on singular {0 1 0} $Ca_2GeO_4$ faces. The $Cr^{4+}$-doped $Ca_2GeO_4$ film 202, illustrated schematically in FIG. 6, was formed on substrate 204 at a deposition temperature range of 800-750° C. using a cooling rate of 5° C./h and a deposition time of 10 h with 30 rpm substrate rotation. For example, by LPE it is possible to grow high optical quality layers of $Cr^{4+}$:$Ca_2GeO_4$ on undoped $Ca_2GeO_4$ substrate from $CaCl_2$—$CaF_2$-based flux. In some embodiments, the layers have a thickness of 50-200 μm and are grown at a temperature in the range of 750-800° C. Thus, these materials, $Cr^{4+}$:$Ca_2GeO_4$ as well as other Ca-based olivines are available to develop $Cr^{4+}$-doped layered structures for mini-lasers and planar waveguide lasers and amplifier applications by liquid phase epitaxy technique with sufficient concentration of $Cr^{4+}$-ions.

Generally, the single crystals have the formula $Cr^{4+}$:$Ca_2Ge_xSi_{1-x}O_4$ where $0 \leq x \leq 1$. In some embodiments, $0 < x < 1$ or $0.1 \leq x \leq 1$ or $0 \leq x \leq 0.9$ or $0.1 \leq x \leq 0.9$. In some embodiments, single crystals can have at least 0.05 wt. % $Cr^{4+}$ and may have at least 0.1 wt. %, 0.5 wt. %, or 1 wt. % $Cr^{4+}$ or more. In some embodiments, the single crystals have 1 to 5 wt. % $Cr^{4+}$.

Figure 2:
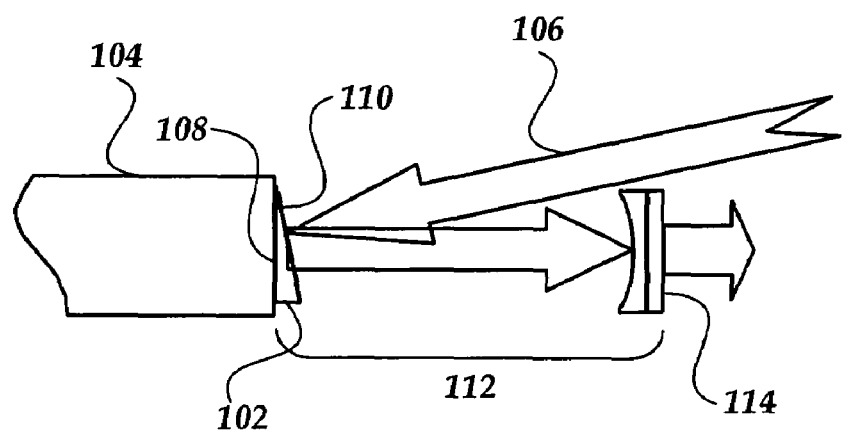
FIG. 2 is a schematic illustration of a third embodiment of a laser, according to the invention.
Figure 7A:
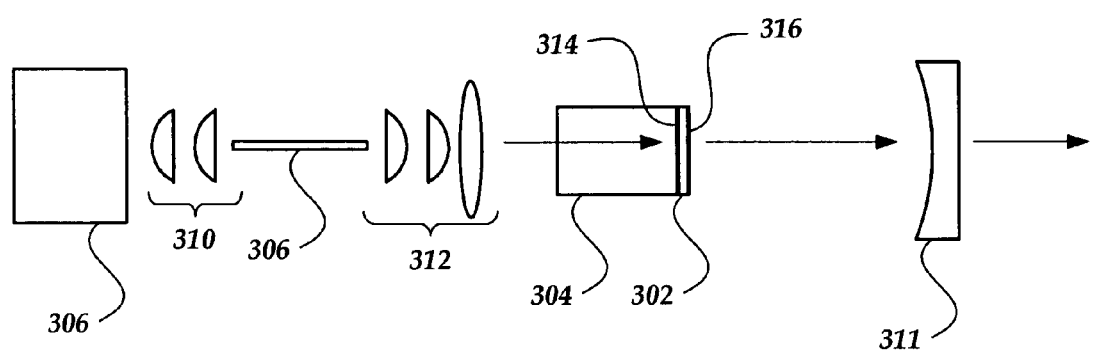
FIGS. 7A and 7B are schematic illustrations of two embodiments of laser systems, according to the invention.

A variety of lasers, including near infrared (NIR) lasers, can be formed using these materials, including, for example, lasers containing the arrangements schematically illustrated in FIGS. 1A, 1B, and 2. One example of a laser system that can be built as all solid state compact lasers with utilizing a thin $Cr^{4+}$:$Ca_2GeO_4$ disk is schematically illustrated in FIG. 7A. At the heart of the laser is a 100-μm thick $Cr^{4+}$:$Ca_2GeO_4$ disk 302 disposed on a transparent heat sink 304 (e.g., a sapphire heat sink.) The disk is pumped with up to 300 W of 800-940 nm light from diode bars 306 (or any other suitable pumping light source.) For example, a laser diode stack consisting of a number bars can be used for pumping. Pumping light is delivered to the laser head by a planar waveguide 308. The radiation emitted by each bar was first collimated individually by a cylindrical microlens 310. A planar waveguide is used to shape the emitting beams of the laser diodes. Two cylindrical lenses 312 are used to focus the collimated diode laser beam into the planar waveguide. Using imaging optics consisting of cylindrical and spherical lenses after the waveguide, a homogeneous pumping line is obtained and coupled into the $Cr^{4+}:Ca_2GeO_4$ disk crystal through a transparent heat sink 304. The dielectric mirror coatings 314, 316 on the disk itself define the resonator of the oscillator. The cooling face of the disk attached to sapphire is coated for high reflectivity at the laser wavelength (e.g., 1.3-1.5 µm) and high transmission at the pumping wavelength (e.g., 800-940 nm), while the other side is high reflection coated for both wavelengths (95% reflectivity at 1.3-1.5 µm, high reflectivity at 800-940 nm).

Figure 7B:
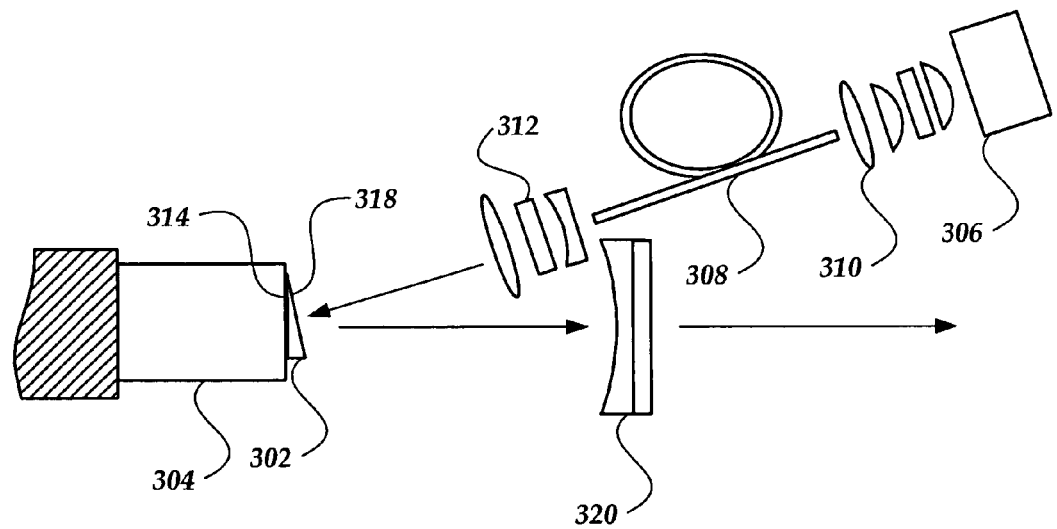

A second example is schematically illustrated in FIG. 7B, where a similar pump assembly (with laser diode bars 306, optics 310, 312, and waveguide 308) is used to pump $Cr^{4+}:Ca_2GeO_4$ wedge 302 from its front surface. Heat management in the gain medium (wedge) is a central to successful operation of this laser and is provided by a heat sink 304 (e.g., a copper heat sink.) The wedge 302 includes a high reflective coating 314 on the back side near the heat sink 304 and an antireflective coating 318 on the front side. A coupler 320 is provided with a 95% reflective coating at the laser wavelength (e.g., 1.2-1.7 µm).

Figure 8:
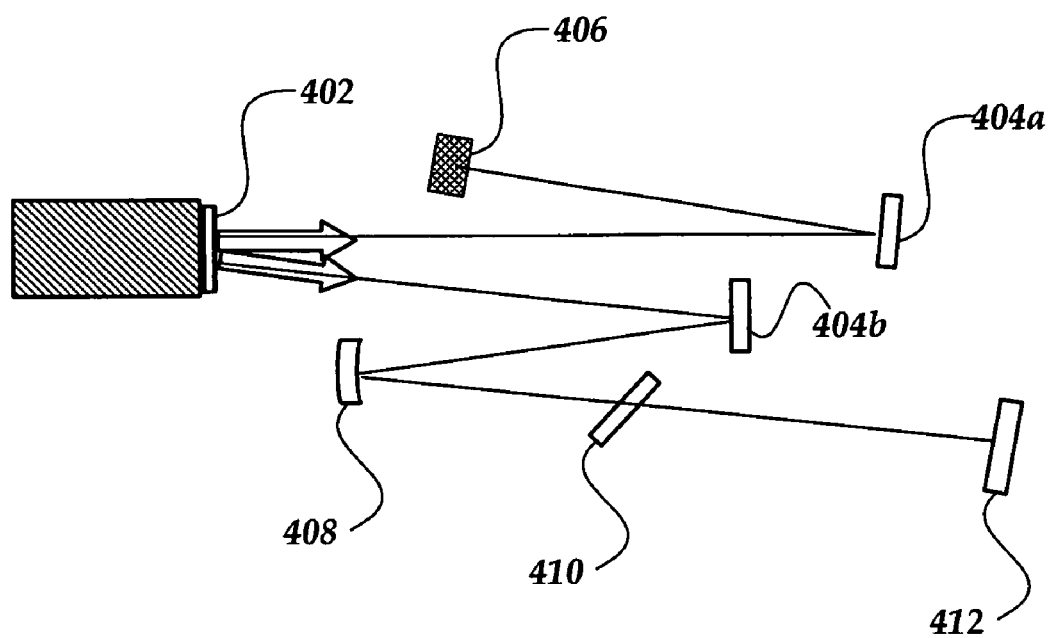
FIG. 8 is a schematic illustration of another embodiment of a laser system, according to the invention.

In another embodiment schematically illustrated in FIG. 8, for pulsed operation, the near-IR light from the laser head (e.g., laser disk 402) can then be directed through series of dispersive mirrors 404a, 404b to a semiconductor saturable absorber mirror 406 that induces passive mode-locking. The laser light can pass through a mirror 408 and a tuning element 410 to an output coupler 412.

Figure 9:
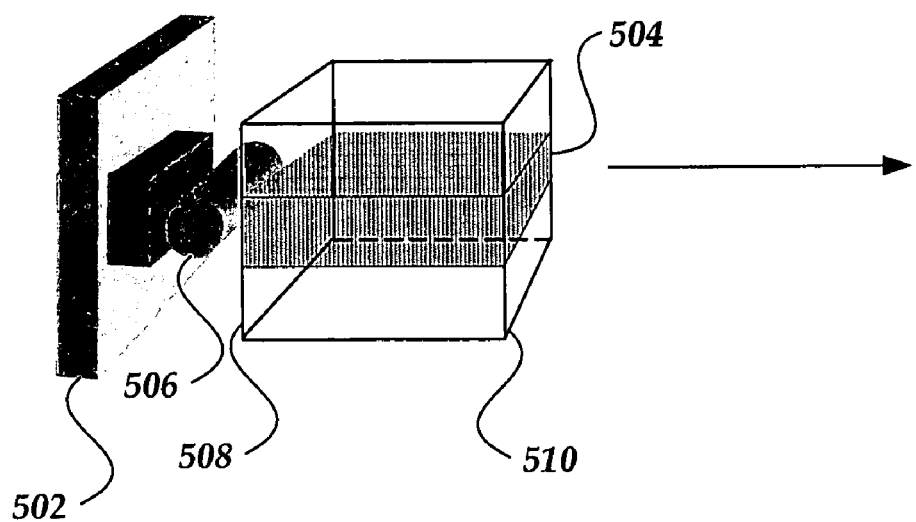
FIG. 9 is a schematic illustration of one embodiment of a waveguide laser/amplifier, according to the invention.

An example of a waveguide laser device is schematically illustrated in FIG. 9. A pump diode laser 502 provide pumping light through a coupling optic 506 to a waveguide 504 made of the $Cr^{4+}$ material described above. As an example, the waveguide has a coating 508 that is highly reflective at the laser frequency (e.g., 1.3-1.5 µm) and highly transmissive at the pumping frequency (e.g, 0.8 to 1.0 µm) and a second coating 510 that is 95% reflective at the laser frequency (e.g., 1.3-1.6 µm.)

It will be recognized that these examples of lasers and waveguide laser devices can include more or fewer components or can be modified in accordance with known configurations of lasers and other devices.

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A laser medium, comprising:
   a single crystal of $Cr^{4+}:Ca_2Ge_xSi_{1-x}O_4$, wherein $0<x<1$.
2. The laser medium of claim 1, wherein $0<x\leq0.9$.
3. The laser medium of claim 1, wherein $0.1\leq x\leq0.9$.
4. The laser medium of claim 1, wherein a concentration of $Cr^{4+}$ in the single crystal is at least 0.5 wt. %.
5. The laser medium of claim 1, wherein a concentration of $Cr^{4+}$ in the single crystal is at least 1 wt. %.
6. The laser medium of claim 1, wherein the laser medium has a thickness of no more than 200 µm.
7. A laser comprising the laser medium of claim 1.
8. The laser of claim 7, wherein the laser medium is a thin disk or thin wedge of $Cr^{4+}:Ca_2Ge_xSi_{1-x}O_4$.
9. The laser of claim 7, further comprising a heat sink attached to a surface of the laser medium.
10. The laser of claim 7, further comprising a pump light source configured and arranged to provide pumping light to the laser medium.
11. The laser of claim 10, further comprising a heat sink attached to a surface of the laser medium, wherein the heat sink is transparent to the pumping light and the pump light source is configured and arranged to direct the pumping light through the heat sink to the laser medium.
12. The laser of claim 10, further comprising a heat sink attached to a back surface of the laser medium, wherein the pump light source is configured and arranged to direct the pumping light to the laser medium through a front surface of the laser medium.
13. The laser of claim 7, further comprising a tuning element to tune a frequency of light emitted by the laser medium.
14. A laser medium, comprising:
    a single crystal of $Cr^{4+}:Ca_2Ge_xSi_{1-x}O_4$, wherein $0\leq x<1$ and wherein the single crystal comprises at least 1 wt. % $Cr^{4+}$.
15. The laser medium of claim 14 wherein the single crystal comprises 1 to 5 wt. % Cr.
16. The laser medium of claim 14, wherein $0<x\leq0.9$.
17. The laser medium of claim of claim 14, wherein x is 0.
18. A laser comprising the laser medium of claim 14.
19. The laser of claim 18, wherein the laser medium is a thin disk or thin wedge of $Cr^{4+}:Ca_2Ge_xSi_{1-x}O_4$.
20. The laser medium of claim 14, wherein $0.1\leq x\leq0.9$.
21. The laser of claim 18, further comprising a pump light source configured and arranged to provide pumping light to the laser medium and a heat sink attached to a surface of the laser medium, wherein the heat sink is transparent to the pumping light and the pump light source is configured and arranged to direct the pumping light through the heat sink to the laser medium.
22. The laser of claim 18, further comprising a pump light source configured and arranged to provide pumping light to the laser medium and a heat sink attached to a back surface of the laser medium, wherein the pump light source is configured and arranged to direct the pumping light to the laser medium through a front surface of the laser medium.

* * * * *